United States Patent [19]

Ladabaum et al.

[11] Patent Number: 5,982,709
[45] Date of Patent: Nov. 9, 1999

[54] ACOUSTIC TRANSDUCERS AND METHOD OF MICROFABRICATION

[75] Inventors: Igal Ladabaum, San Carlos; Xuecheng Jin, Stanford; Butrus T. Khuri-Yakub, Palo Alto, all of Calif.

[73] Assignee: The Board of Trustees of the Leland Stanford Junior University, Palo Alto, Calif.

[21] Appl. No.: 09/052,818

[22] Filed: Mar. 31, 1998

[51] Int. Cl.⁶ .................................................. H04R 17/00
[52] U.S. Cl. .......................... 367/170; 367/173; 367/174; 381/174
[58] Field of Search .................................... 367/170, 173, 367/174, 163, 165; 381/169, 174, 205

[56] References Cited

U.S. PATENT DOCUMENTS

| | | | |
|---|---|---|---|
| 3,715,638 | 2/1973 | Polye | 317/247 |
| 3,736,552 | 5/1973 | Sessler et al. | 340/5 MP |
| 3,786,495 | 1/1974 | Spence | 340/365 C |
| 3,946,422 | 3/1976 | Yagi et al. | 357/26 |
| 3,973,146 | 8/1976 | Arnold et al. | 357/26 |
| 4,081,626 | 3/1978 | Muggli et al. | 179/111 R |
| 4,246,449 | 1/1981 | Biber | 179/111 R |
| 4,262,399 | 4/1981 | Cady | 29/25.42 |
| 4,429,192 | 1/1984 | Busch-Vishniac et al. | 179/111 E |
| 4,432,007 | 2/1984 | Cady | 357/26 |
| 4,439,641 | 3/1984 | Paglia | 179/111 R |
| 4,524,247 | 6/1985 | Lindenberger et al. | 179/111 R |
| 4,530,077 | 7/1985 | Dorr | 367/140 |
| 4,533,795 | 8/1985 | Baumhauer, Jr. et al. | 179/111 E |
| 4,783,821 | 11/1988 | Muller et al. | 381/173 |
| 4,887,246 | 12/1989 | Hossack et al. | 367/140 |
| 4,887,248 | 12/1989 | Griebeler | 367/181 |
| 4,910,840 | 3/1990 | Sprenkels et al. | 29/25.41 |
| 4,922,471 | 5/1990 | Kuehnel | 367/181 |
| 5,095,401 | 3/1992 | Zavrachy et al. | 361/283 |
| 5,177,661 | 1/1993 | Zavrachy et al. | 361/283 |
| 5,208,789 | 5/1993 | Ling | 367/181 |
| 5,408,731 | 4/1995 | Berggvist et al. | 29/25.41 |
| 5,619,476 | 4/1997 | Haller et al. | 367/181 |

FOREIGN PATENT DOCUMENTS 892773 10/1953 Germany .

OTHER PUBLICATIONS

H. T. Soh, "Silicon micromachined ultrasonic immersion transducers", Applied Physics vol. 69 No. 24, Dec. 9, 1996, pp. 3674–3676.

Eccardt et al., "Surface micromachined ultrasound transducers in CMOS technology", 1996 IEEE Ultrasonics Symposium, pp. 959–962.

Eccardt, et al., "Micromachined Transducers for Ultrasound Applications", 1997 IEEE Ultrasonics Smposium, pp. 1609–1618.

Schindel, et al., "The Design and Characterization of Micromachined Air–Coupled Capacitance Transducers", IEEE Transactions on Ultrasonics, Ferroelectrics and Frequency Control, vol. 42, No. 1, Jan. 1995.

Haller et al., "A surface micromachined electrostatic ultrasonic air transducer", IEEE Transactions of Ultrasonics, Ferroelectrics and Frequency Control, vol. 43, No. 1, pp. 1–6, Jan. 1996.

*Primary Examiner*—Ian J. Lobo
*Attorney, Agent, or Firm*—Flehr Hohbach Test Albritton & Herbert LLP

[57] ABSTRACT

There is provided an acoustic transducer which includes a membrane of selected size and shape supported at its edges spaced from a first conductive electrode by an integral support structure with the second conductive electrode comprising a thin metal film on the membrane. The active membrane area is undisturbed by etch vias.

9 Claims, 6 Drawing Sheets

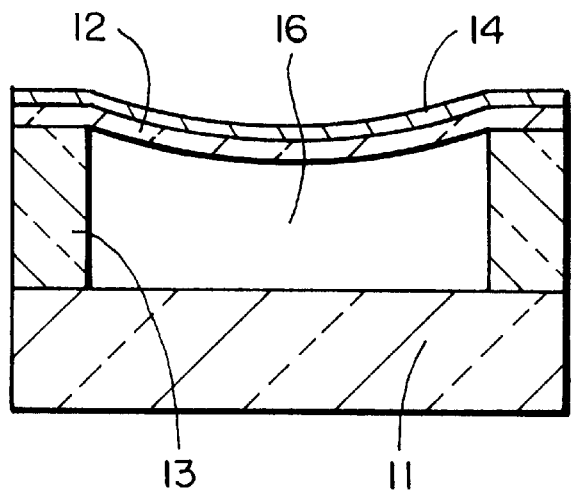
FIG_1
*(PRIOR ART)*
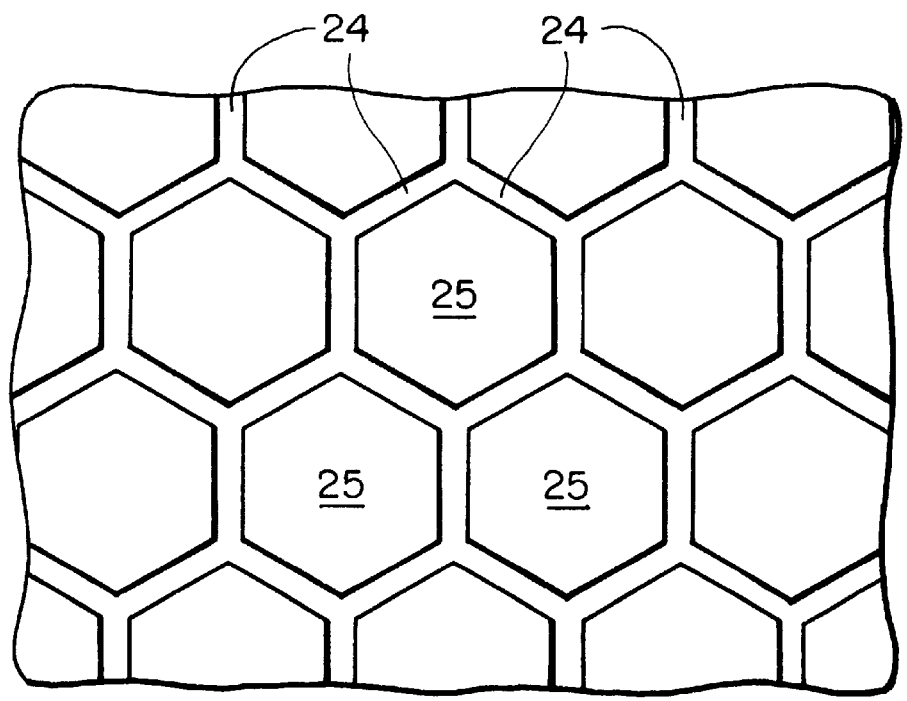
FIG_3

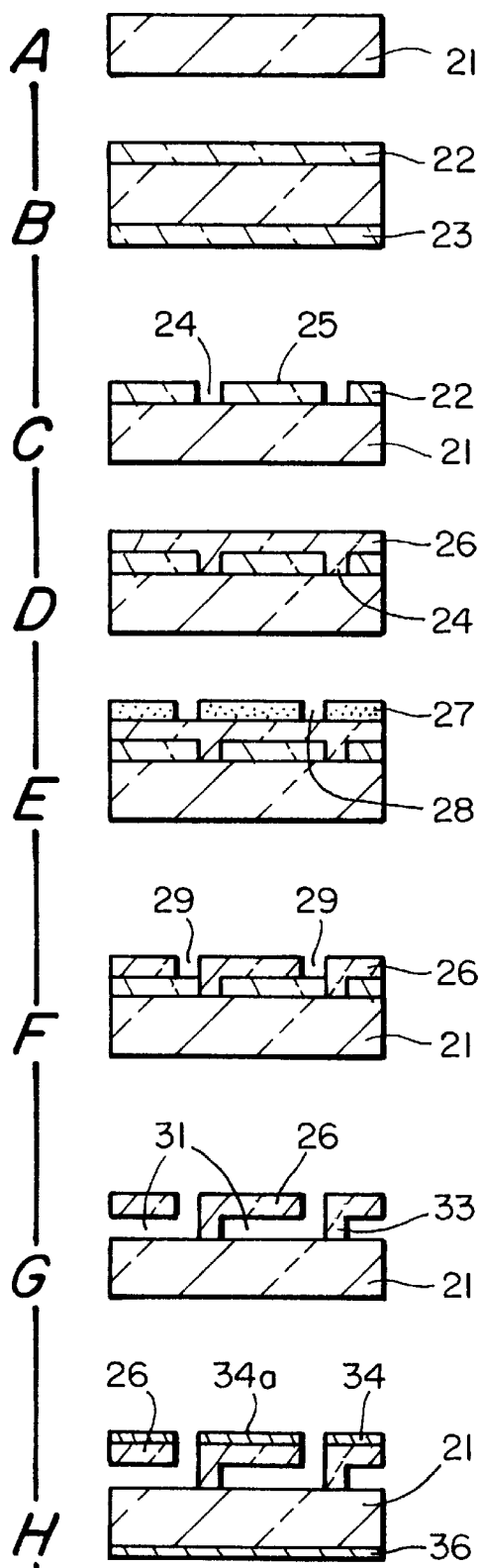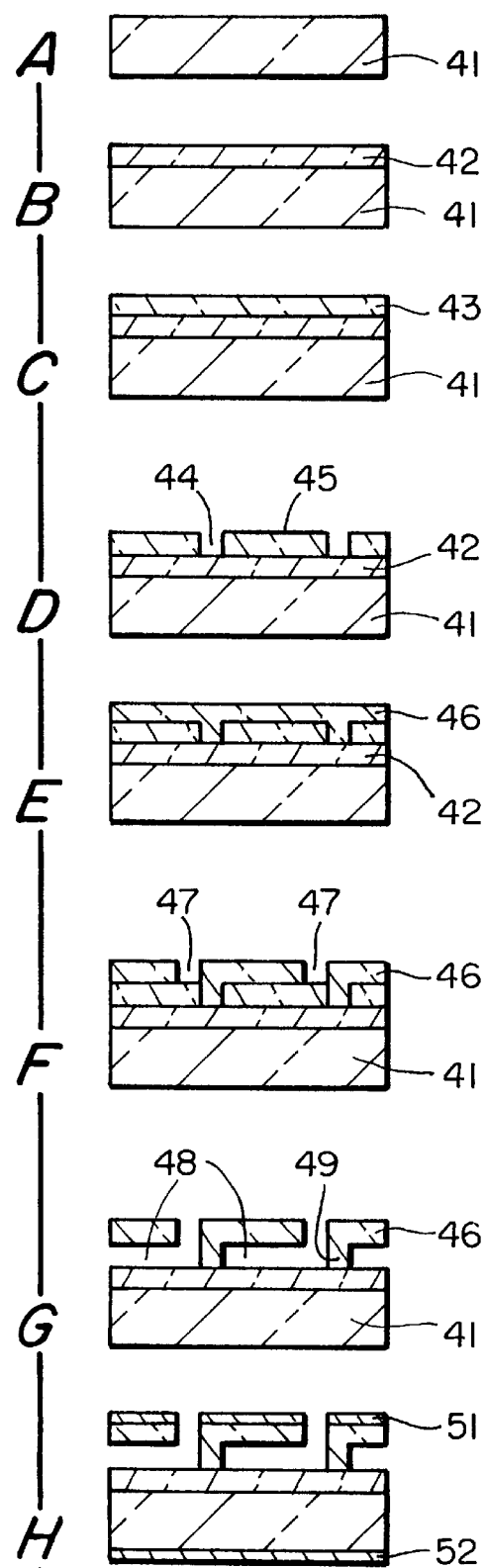

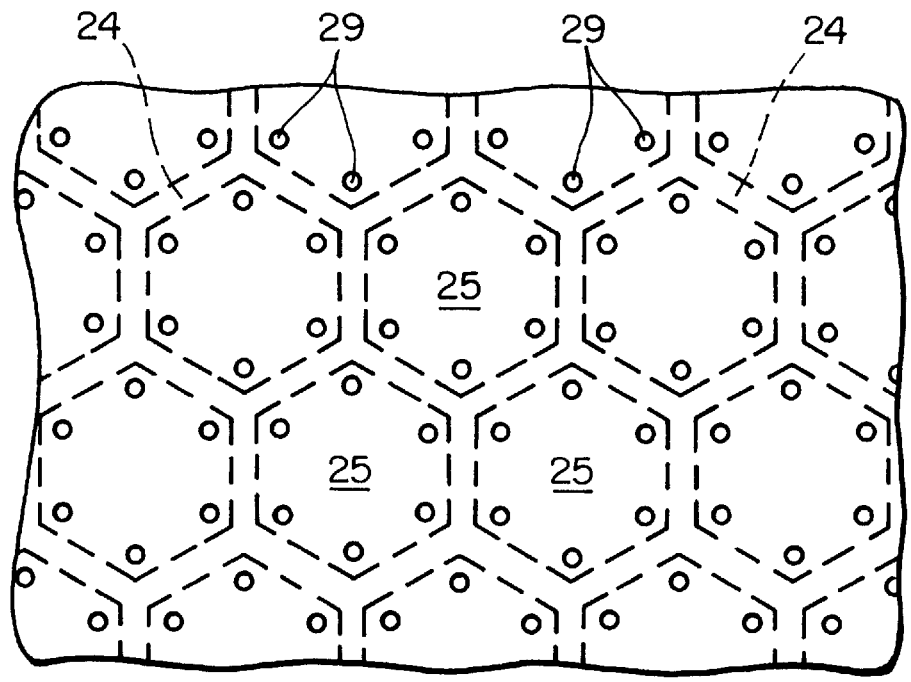
FIG_4
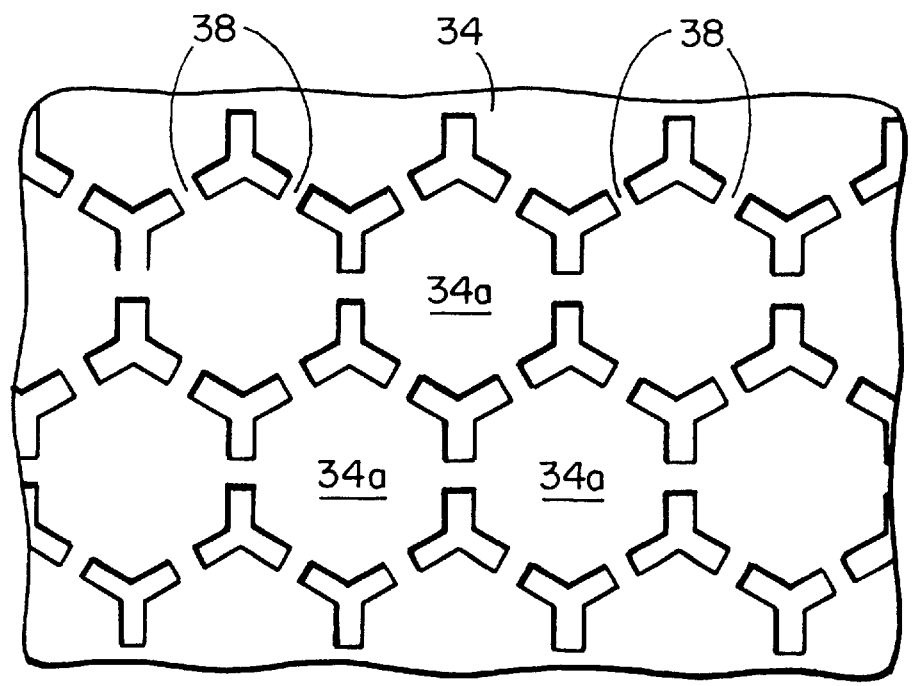
FIG_5

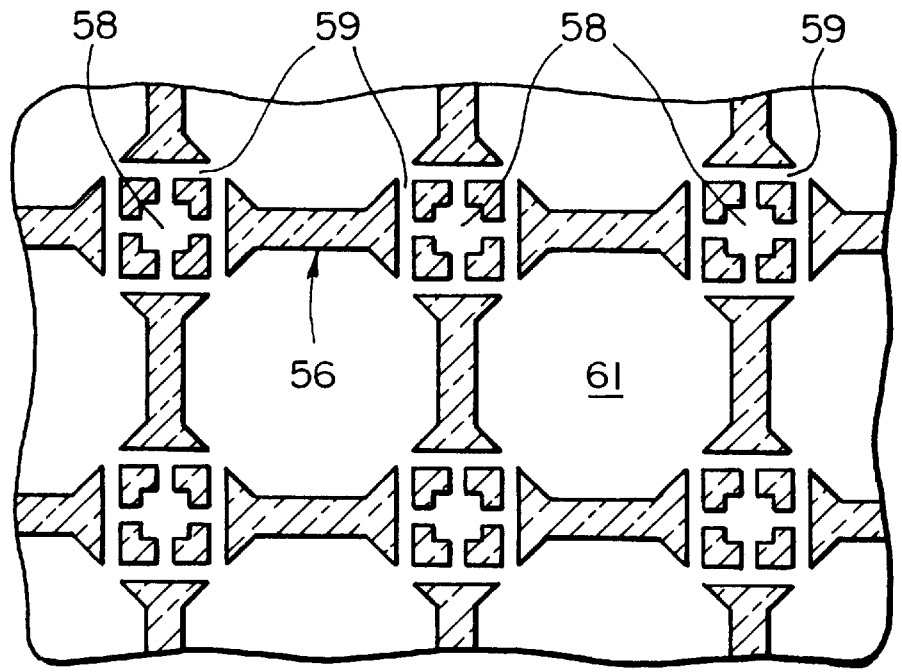
FIG_7
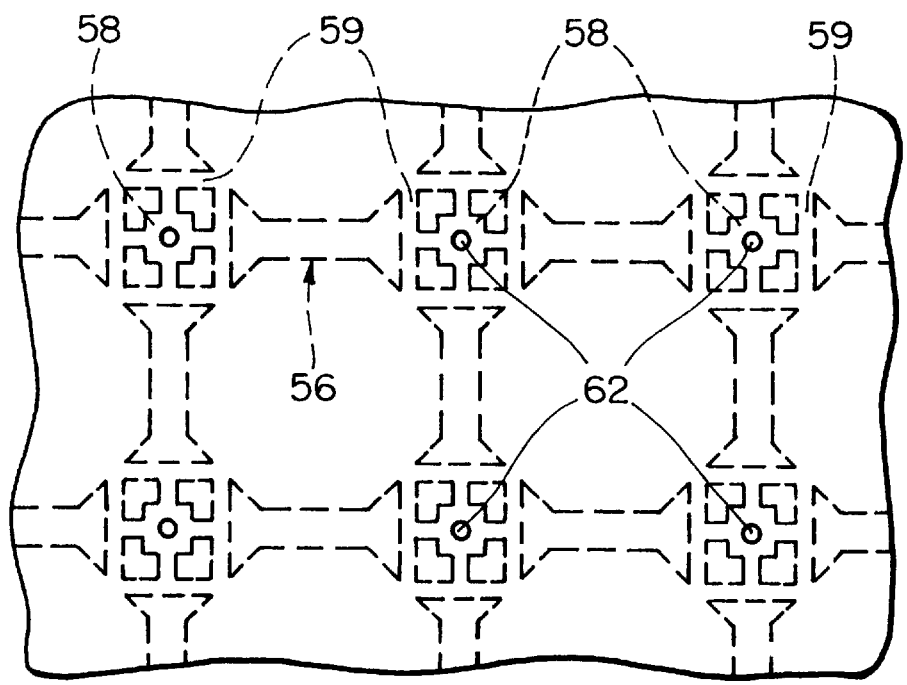
FIG_8

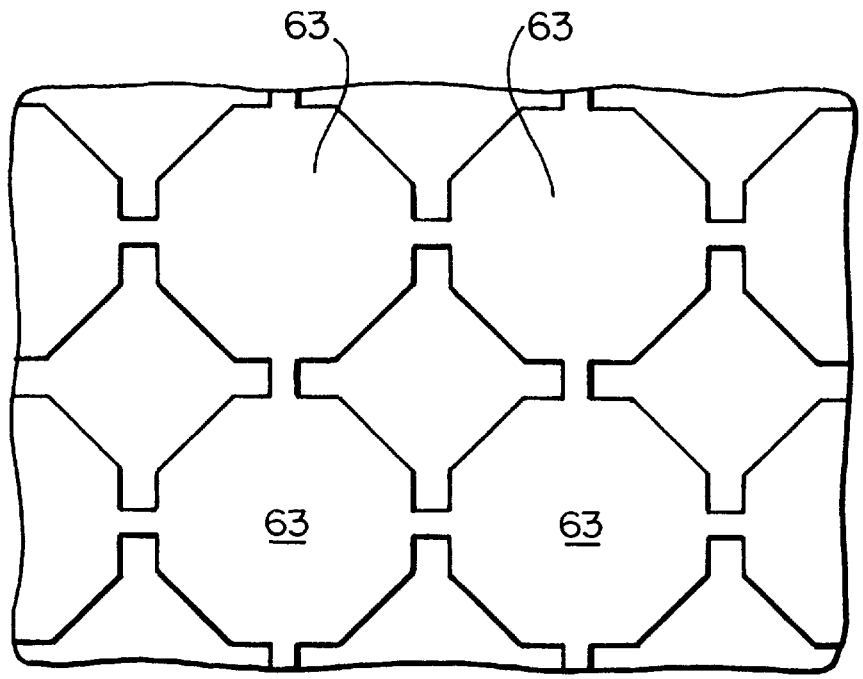
FIG_9
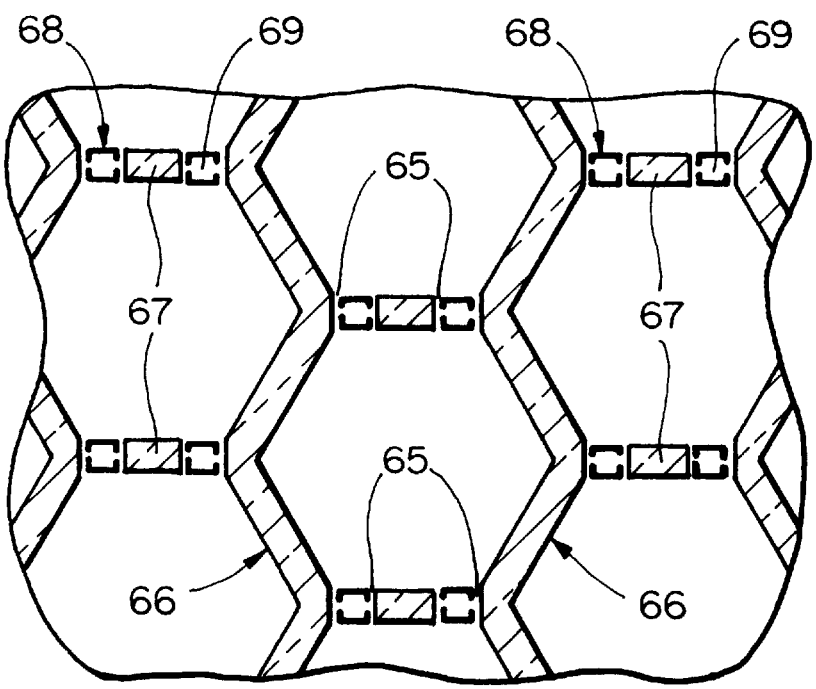
FIG_10

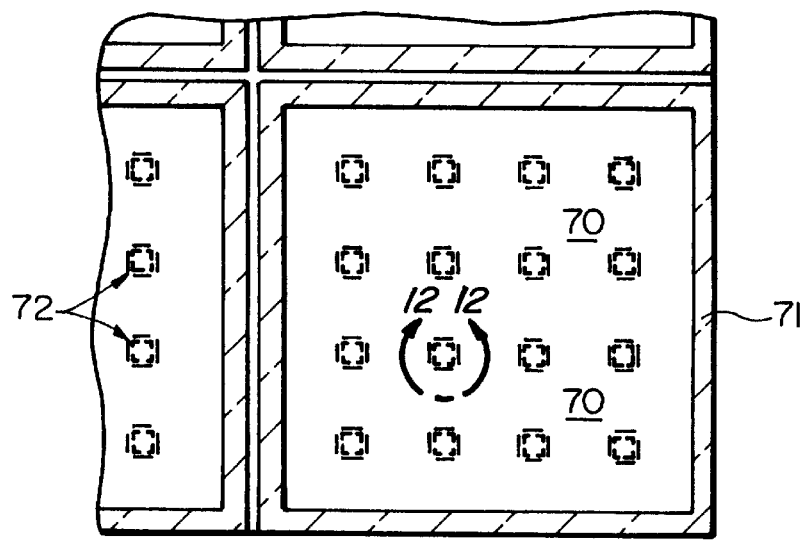
FIG_11
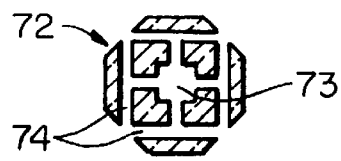
FIG_12
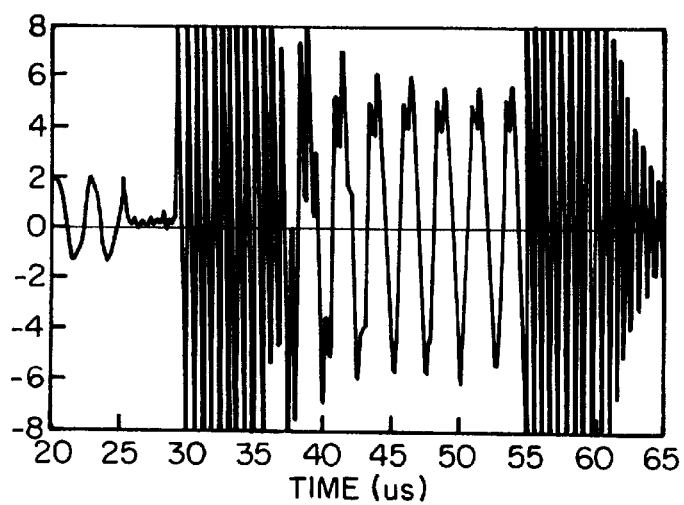
FIG_13

ACOUSTIC TRANSDUCERS AND METHOD OF MICROFABRICATION

GOVERNMENT SUPPORT

This invention was made with Government support under contract N00014-94-1-0730 and N00014-96-1-1099 awarded by the Department of the Navy ONR. The Government has certain rights in this invention.

BRIEF DESCRIPTION OF INVENTION

This invention relates generally to acoustic transducers and to a method of microfabrication, and more particularly to acoustic transducers in which the shape of the membrane (s) is lithographically defined during microfabrication, and the vibrating membrane and its support are formed during the same thin film deposition, and to acoustic transducers in which the membrane(s) is undisturbed by etch vias.

BACKGROUND OF THE INVENTION

The basic structure of a capacitive acoustic transducer is that of a conductive membrane suspended above a conductive electrode. When a voltage is applied between the membrane and the electrode, coulombic forces attract the membrane to the electrode. If the voltage applied varies in time, so too will the membrane position, emitting sound at the frequency of the voltage modulation (membrane deflection). Conversely, acoustic vibrations will set the membrane in motion, and the resulting capacitance variation can be detected electrically. A capacitive acoustic transducer can consist of one or many such membranes. A sketch of a single membrane acoustic transducer is shown in FIG. 1. A transducer consists of many such elements. Each transducer element includes a conductive substrate 11 such as a silicon. A membrane 12, which may be silicon nitride, is supported above the substrate by an insulating support 13, such as silicon oxide. A conductive film or layer 14, such as gold, forms a conductive electrode. The film and silicon substrate form the electrodes of the transducer. The transducer may be a sealed transducer with the space 16 evacuated.

Co-pending application Ser. No. 08/792,114, filed Jan. 31, 1997, describes microfabricated electrostatic ultrasonic transducers; co-pending application Ser. No. 08/739,446 filed Oct. 29, 1996 describes broadband ultrasonic transducers and a method of fabrication; and U.S. Pat. No. 5,894,452, issued Apr. 13, 1999 describes an immersion ultrasonic transducer and method of fabrication. The foregoing applications are incorporated herein in their entirety by reference.

It is known that the shape of the membrane(s), in combination with the material properties of the membrane(s) and the medium, will determine the transducer's resonant frequency and quality factor. In co-pending application Ser. No. 08/739,446 the membrane shape was determined by the location of the access holes or vias which allowed etchant to remove selected portions of a sacrificial layer. Errors from the desired geometry can result because of variations of etchant activity (temperature, shelf life, contamination, etc.) and etching time. Furthermore, complex shapes are only approximated, not precisely defined. It would be advantageous to provide a method of microfabricating an acoustic transducer in which the membrane shape and geometry is precisely defined, the membrane is not perturbed by vias needed for the sacrificial etching and in which vacuum sealing can be achieved with a wide variety of chemical species.

OBJECTS AND SUMMARY OF THE INVENTION

It is a general object of the present invention to provide a microfabrication method which allows precise control of transducer membrane geometry.

It is another object of the present invention to provide an acoustic transducer in which the membrane and its support are of the same material formed during the same deposition.

It is a further object of the present invention to provide an acoustic transducer in which the geometry of the membrane and its support are lithographically defined.

It is a further object of the present invention to provide an acoustic transducer in which the membrane and its support are silicon nitride or polysilicon.

It is another object of the present invention to provide an acoustic transducer in which the membrane does not have any etch vias.

It is a further object of the present invention to provide a dual mode low frequency acoustic transducer.

In accordance with the present invention there is provided an acoustic transducer which includes membranes of selected shape supported spaced from a conductive electrode by an integral support of the same material with the second conductive electrode on said membranes. There is also described a method of microfabricating an acoustic transducer in which the shape of the support and the membrane is lithographically defined. In one embodiment the method provides a membrane which is unperturbed by etchant access holes or vias.

BRIEF DESCRIPTION OF THE DRAWINGS

The foregoing and other objects of the invention will be more clearly understood from the following description when read in conjunction with the accompanying drawings in which:

FIG. 1 is a sectional view of an acoustic transducer in accordance with the prior art.

FIGS. 2A–2H show the steps of forming an acoustic transducer array in accordance with one microfabrication method of the present invention.

FIG. 3 is a top plan view of a portion of the acoustic transducer array at the fabrication step shown in FIG. 2C.

FIG. 4 is a top plan view of a portion of the transducer array at the fabrication step shown in FIG. 2F.

FIG. 5 is a top plan view of a portion of an acoustic transducer array at the fabrication step shown in FIG. 2H.

FIGS. 6A–6H show the steps of forming an acoustic transducer array in accordance with another microfabrication method in accordance with the present invention.

FIG. 7 is a sectional view of transducers at step 2G, 6G in another embodiment of the present invention which shows etchant reservoir and channels.

FIG. 8 is a top plan view showing vias extending to the reservoir.

FIG. 9 is a top plan view of the acoustic transducer of FIGS. 7 and 8 with patterned metallization.

FIG. 10 is a sectional view of another transducer configuration at step 2G, 6G showing etchant reservoir and channels.

FIG. 11 is a sectional view of a dual mode acoustic transducer in accordance with the present invention.

FIG. 12 is an enlarged view of the element 12—12 of FIG. 11.

FIG. 13 shows the frequency response of the dual mode acoustic transducer of FIG. 11.

DESCRIPTION OF PREFERRED EMBODIMENT

In accordance with the present invention there is provided a method of fabricating an electroacoustic ultrasonic transducer of the type in which a membrane such as polysilicon or silicon nitride is supported above a conductive substrate by a support structure formed of the same material as the membrane in which the shape and size of the acoustic membrane can be accurately defined. The process permits the fabrication of broad band ultrasonic transducers comprising an array of membranes of different sizes and shapes, or can permit the formation of a narrow band ultrasonic array comprising a plurality of membranes of the same size. The geometry of the device including gap thickness, membrane thickness, and area can be easily controlled to optimize the transducer operation. In the prior art, the efficiency of transducers is reduced by the fact that the microfabricated ultrasonic transducers comprise thousands of active membranes joined by inactive support structures. In the present invention the support structure can be actively tailored and minimized, thereby increasing the efficiency of the ultrasonic transducer. The shape and size of the support structure is, in accordance with the present invention, lithographically defined. The present invention also provides sealed ultrasonic transducers in which the membranes are undisturbed by etch vias.

FIGS. 2A–2G schematically illustrate the steps of forming a multi-membrane electrostatic ultrasonic transducer. The starting material is a silicon substrate 21 which is treated to have high conductivity at its surface as, for example, by a phosphorous gas phase drive in at high temperature [FIG. 2A]. A low temperature silicon dioxide film or layer 22 and 23 is deposited to pre-determined thickness [FIG. 2B]. The thickness of this layer determines the membrane spacing as will presently become apparent. The next step in the process is to apply a resist film (not shown) to the surface of the silicon oxide film 22. The resist film is then lithographically or E beam patterned (not shown) and the wafer is then dry etched to form hexagonal or other shaped channels or trenches 24 which form shaped silicon dioxide islands 25 which define the active membrane region [FIG. 3]. The lower oxide film 23 is removed as by etching. The lithographically defined islands can have any desired shape and size. For example, referring to the plan view of FIG. 2C [FIG. 3] the channels or trenches may be shaped in the form of hexagons to form hexagonal islands 25. The next step is to deposit a silicon nitride film 26 over the silicon dioxide film. The nitride extends into the trenches 24 [FIG. 2D]. The next step is to apply a resist film 27 over the silicon nitride film [FIG. 2E]. The resist film is then lithographically or E-beam patterned and etched to form windows or apertures 28 which extend down to the silicon nitride film [FIG. 2E]. Vias 29 are there formed in the silicon nitride by etching to extend down to the silicon dioxide film 22 [FIG. 2F]. The resist is then removed.

In one example, apertures or vias were formed at the corners of the hexagonal shaped oxide islands defined by the grooves. This is schematically illustrated in the top plan view of FIG. 4. It is of course to be understood that the pattern of apertures or vias need not necessarily be as illustrated, but may be randomly located, the key being to expose the underlying silicon dioxide film. The vias are preferably two microns or less in diameter. The wafer is then subjected to an etching step in which the silicon dioxide is etched by employing an etchant such as hydrofluoric acid which passes through the vias and etches away the underlying silicon dioxide to form hexagonal cavities 31 [FIG. 2G]. This leaves a silicon nitride membrane 26 supported by the integral silicon nitride support 33 formed during the silicon nitride deposition step. The silicon nitride and the silicon substrate act as etch stops whereby the size and shape of the cavity is defined by the thickness of the silicon dioxide and the silicon nitride supports 33. The next step is to form electrodes by applying a conductive film 34 to the upper surface of the silicon nitride membrane and a conductive film 36 to the lower surface of the substrate. The upper film 34 is patterned as for example by photolithography and etching to form contact regions 34a interconnected by leads 38.

By way of example, the size and configuration of the silicon nitride support may be such as to form hexagonal membranes 100 microns between opposite vertices which will operate at a frequency of 2.3 MHz in air, or circular membranes having 50 microns diameter which will operate at a frequency of 6 MHz in air.

The process described with reference to FIGS. 2A–2H, 3, 4 and 5 provides a method of microfabrication in which the size and shape of the membranes and the size and shape of the silicon nitride supporting structure is photolithographically defined in contrast to the prior art, wherein the size and shape of the membrane and support structure relied not only upon the location of apertures or vias but also upon the control of etching time and etchant.

Referring to FIGS. 6A–6H, another method of forming an electrostatic ultrasonic transducer in which the size and shape of the support structure and membrane is lithographically defined is illustrated. In this method, a material system is chosen in which there is higher selectivity by the etchant for the sacrificial material as compared to the membrane material. Thus large volumes of sacrificial material can be removed without attacking the membrane or its integral support. A suitable material system comprises a substrate such as silicon 41 [FIG. 6A] having a thin silicon nitride layer 42 deposited by chemical vapor deposition employing silane and ammonia [FIG. 6B]. Next a polysilicon layer 43 is deposited over the silicon nitride layer [FIG. 6C]. A photoresist film is then applied and photolithographically patterned and then subjected to a plasma etch which etches the trenches 44 through the polysilicon film down to the silicon nitride film to form polysilicon islands 45 [FIG. 6D]. This step is followed by depositing a silicon nitride layer or film 46 [FIG. 6E] having a pre-determined level of stress. For example, the silicon nitride film may be formed by chemical vapor deposition employing silane and ammonia and can have its residual stress controlled by controlling the proportion of silane to ammonia during the deposition process. The silicon nitride covers the polysilicon islands 45 and extends down into the channels 44 to the underlying silicon nitride film 42 [FIG. 6E]. As described above with reference to FIG. 2F, the silicon nitride film has a photoresist film applied which is lithographically exposed and then etched to form openings or vias 47 in the silicon nitride film 46 which extend down to the polysilicon film [FIG. 6F]. The wafer is then subjected to etchant solution which etches away the polysilicon film to leave the cavity 48. The silicon nitride serves as an etch stop whereby the etchant is selected to etch the polysilicon deposition but not etch the silicon nitride whereby the silicon nitride supports 49 are clearly defined and determined by the photolithographic exposure of the initial resist film. The etchant can be KOH (potassium hydroxide), TMAH (tetra-methyl ammonium hydroxide), or XeF2 (xenon difluoride). KOH and TMAH are liquid solutions, while XeF2 is a gaseous etch. All provide excellent selectivity of polysilicon to nitride (in excess of 1000:1) and thus minimize etching of the silicon nitride when large volumes of the sacrificial layer need to be etched.

Thin film electrodes 51, 52 are then applied to the upper surface of the silicon nitride membranes and to the lower surface of the silicon substrate. As discussed above, prior to forming the conductive film, the structure may be subjected to a further silicon nitride deposition which forms a layer which seals the vias. The silicon nitride deposition can be carried out at atmospheric pressure or under a vacuum whereby the underlying cavity may be at atmospheric or reduced pressure.

A transducer having a polysilicon membrane may be formed by the method discussed above with reference to FIGS. 6A–6H by using a low temperature oxide as the sacrificial layer and depositing a polysilicon film over islands and in trenches which are lithographically defined. BOE (buffered oxide etch), a hydrofluoric acid solution, is the etchant with this material system. A nitride layer is needed over the substrate to insulate the polysilicon-supported polysilicon membrane from the substrate.

In the foregoing embodiments and processes the etchant openings or vias are formed in the active membrane portion above the cavities. It is preferable to provide a transducer in which the membrane is not disturbed by openings or vias and in which the sealant species is prevented from entering the cavities or active volume. In certain applications, as for example described in co-pending application Ser. No. 08/741,404, it is desired to form sealed cavities. In such instances, a silicon nitride layer may be deposited over the silicon nitride membranes [FIG. 2G] so that the silicon nitride layer seals the vias prior to application of the conductive film. In order to minimize the entry of the sealing species (i.e. silicon nitride) into the transducer cavity thereby perturbing the performance of the device, the vias need to be less than 0.3 μm in diameter. In such instances, the sealing can take place in an atmospheric pressure chemical vapor deposition chamber, or, if desired, the sealing can take place in an evacuated low pressure chamber whereby the sealed cavities can have reduced pressure. Because sub-micron lithography is more costly than g-line lithography, it is preferable to provide an embodiment where the sealant species is prevented from entering the transducer cavities when lithographic dimensions are larger than 1 μm. Thus, in another embodiment, access to the sacrificial islands is through tortuous channels which extend from a buffer region to the edges of the islands. Vias or openings in the membrane film extend into the buffer region.

FIG. 7 is a sectional view of a transducer at steps 2G, 6G with a membrane support structure 56 which includes etchant reservoirs 58 and tortuous channels 59. The structure defines cavities 61. The support structure is formed by lithographically defining and etching away selected portions of a sacrificial layer and then depositing the thin film membrane material, silicon nitride or polysilicon, which covers the remaining sacrificial material and extends into the etched portions of the sacrificial layer. The material which is deposited in the etched portion forms the support structure 56. Etchant is introduced into the reservoirs 57 through vias or apertures 62 formed in the membrane material above the reservoir 58 [FIG. 8]. The etchant etches the sacrificial material at the reservoir and then the channels and travels to and etches the sacrificial islands. This forms the support structure 56 with reservoirs 58 and tortuous channels 59 [FIG. 7]. When the transducer is sealed by vapor deposition of the same material as the membrane, silicon nitride or polysilicon, the species which enters the reservoir through the aperture or via 62 are prevented from traveling directly into the cavities 61. They strike the walls of the channels 59 and deposit on the walls, and the channels are plugged before sealant reaches the cavity. That is, sealant does not enter the transducer cavities 61. Thus sealing of the transducers is accomplished without affecting the performance of the transducers. The tortuous channels also permit other types of sealing, such as spin coating. The completed transducer then has electrodes 63 applied [FIG. 9].

FIG. 10 is a sectional view showing a different support configuration for forming hexagonal cavities and membranes. The support includes a zig-zag membrane support 66 with bridges 67 which includes etchant reservoirs 69 and channels 65. The processing steps are the same as previously described. Tortuous passages are defined by the channels 65.

FIG. 11 is a sectional view showing a dual mode acoustic transducer. The membrane 70 support comprises a rectangular frame 71 with a plurality of posts 72 each post including an etchant reservoir 73 and channels 74. The transducer is formed as described above with respect to other embodiments. The transducer operates at two frequencies. The resonant frequency of the membrane defined by the frame 71 and the resonant frequency of the membrane portions between posts 72. Sealing is accomplished by vapor deposition as previously described. Figure shows the transmission of ultrasound with the post supported structure of FIG. 11. Both 1.7 MHz and 400 KHz waves are excited, thus demonstrating the multimode character of the transducer.

Thus there has been provided an ultrasonic transducer in which the size and shape of the membranes can be accurately defined by lithographic techniques. The spacing of the membrane is defined by the deposition of a sacrificial layer. The transducer includes membranes supported by the same integral material, because the support and membrane are formed with the same deposition. Sealed transducers with undisturbed membranes and cavities are also provided.

What is claimed is:

1. An acoustic transducer comprising a silicon substrate forming a first electrode, a membrane of selected shape supported at its edges spaced from said substrate by an integral support structure of the same material as the membrane, and a conductive film is carried by said membrane to form a second electrode of said acoustic transducer characterized in that the support structure includes reservoirs and tortuous channels communicating between the reservoirs and the space between the substrate and the membrane.

2. An acoustic transducer as in claim 1 in which said membrane and support structure are silicon nitride.

3. An acoustic transducer as in claim 1 in which said membrane and integral support structures are polysilicon and a silicon nitride layer is interposed between said support structure and said silicon substrate.

4. An acoustic transducer as in claim 2 in which said silicon nitride support supports the membrane directly on said silicon substrate.

5. An acoustic transducer as in claim 1, 2, 3 or 4 which includes a plurality of silicon nitride membranes of selected size and shape.

6. An acoustic transducer as in claim 1, 2, 3 or 4 in which the reservoirs and channels are sealed to seal the space between the substrate and the membrane to form a sealed cavity whereby the transducer can be immersed in a liquid.

7. An acoustic transducer as in claim 5 in which the support structure includes a plurality of spaced posts each including tortuous channels and a reservoir.

8. An acoustic transducer as in claim 1 including a plurality of spaced support posts spaced from the edge support structure to provide a dual mode transducer.

9. An acoustic transducer as in claim 8 in which the support posts include a reservoir and tortuous channels.

* * * * *